US009087041B2

(12) United States Patent
Weir

(10) Patent No.: US 9,087,041 B2
(45) Date of Patent: Jul. 21, 2015

(54) ENTERPRISE TEST SYSTEM PLATFORM AND ASSOCIATED METHOD FOR INTEROPERABLE TEST DATA MANAGEMENT, TEST DEVELOPMENT, TEST LIBRARIES AND TEST WORKFLOW MANAGEMENT AND AUTOMATION

(76) Inventor: Michael Weir, Boca Raton, FL (US)

( * ) Notice: Subject to any disclaimer, the term of this patent is extended or adjusted under 35 U.S.C. 154(b) by 0 days.

(21) Appl. No.: 13/557,183

(22) Filed: Jul. 24, 2012

(65) Prior Publication Data

US 2014/0032637 A1  Jan. 30, 2014

(51) Int. Cl.
| | |
|---|---|
| *G01R 27/28* | (2006.01) |
| *G01R 31/00* | (2006.01) |
| *G01R 31/14* | (2006.01) |
| *G06F 11/273* | (2006.01) |
| *G06F 13/10* | (2006.01) |
| *G06F 11/26* | (2006.01) |
| *G06F 11/27* | (2006.01) |
| *H04L 12/24* | (2006.01) |

(52) U.S. Cl.
CPC ............ *G06F 11/273* (2013.01); *G06F 11/26* (2013.01); *G06F 11/27* (2013.01); *G06F 13/105* (2013.01); *H04L 41/5035* (2013.01); *H04L 41/5038* (2013.01)

(58) Field of Classification Search
CPC ............ H04L 41/5035; H04L 41/5038; G06F 13/105; G06F 9/455; G06F 11/26; G06F 11/261; G06F 11/27; G06F 11/273; G06F 11/3457
USPC ............ 702/57, 118, 121, 182, 189; 714/742, 714/738, 703; 709/224
See application file for complete search history.

(56) References Cited

U.S. PATENT DOCUMENTS

| | | | | |
|---|---|---|---|---|
| 2005/0283339 A1* | 12/2005 | Homma | ........................ | 702/182 |
| 2007/0244663 A1* | 10/2007 | Haemel et al. | ................ | 702/121 |
| 2009/0192761 A1* | 7/2009 | Pearl | .............................. | 702/182 |
| 2011/0106496 A1* | 5/2011 | Napolin et al. | ................ | 702/182 |
| 2013/0030764 A1* | 1/2013 | Chatterjee et al. | ............. | 702/182 |
| 2013/0096880 A1* | 4/2013 | Choi et al. | ..................... | 702/182 |
| 2013/0226520 A1* | 8/2013 | Macik et al. | ................... | 702/182 |
| 2013/0282334 A1* | 10/2013 | Diperna et al. | ................ | 702/183 |

\* cited by examiner

*Primary Examiner* — Le H Luu
(74) *Attorney, Agent, or Firm* — Vinod Doddamani

(57) ABSTRACT

This Invention provides a system-level framework for an enterprise-level test environment. The environment provides test development, automation, and execution processes for product validation and verification, and allows the interoperability of test cases, data, equipment information, and results across various enterprise platforms. The system, with its processes and methods, provides various mechanisms for managing test configurations, developing test plans, managing test data, and developing test reports from one or more teststations and/or from one or more test equipment(s) for one or more Device(s) Under Test (DUT). These mechanisms include, but are not limited to, functions such as data management and sharing, test library reusability, test station management, test configuration management, test execution, test report development, and data mapping/plotting. The system can be customized to support scalable enterprise requirements. The development of the standardized data handling and communication processes and methods allows inter-system communication and interoperability of test information across various platforms.

20 Claims, 6 Drawing Sheets

ENTERPRISE TEST SYSTEM PLATFORM AND ASSOCIATED METHOD FOR INTEROPERABLE TEST DATA MANAGEMENT, TEST DEVELOPMENT, TEST LIBRARIES AND TEST WORKFLOW MANAGEMENT AND AUTOMATION

FIELD OF INVENTION

The field of invention relates to an enterprise level test environment which provides a method for test configuration, developing and managing test data and test reports in interoperable ways across various testing platforms.

BACKGROUND OF THE INVENTION

Generating, collecting, analyzing and consuming test data are keys to business intelligence for companies. Managing the creation of test plans, test automation, test data and then utilization of very expensive assets becomes a discipline and process of its own. The tests are often too complex to do manually and far too time consuming to be executed in a manufacturing environment. This testing process is not only time consuming but also resource intensive and thereby negatively impacting impacts the overall system design productively. The framework of database and test tools wrapped around this process is referred to as a test automation framework. Test automation is a key component of test processes and critical to enhancing the productivity of the overall team. Such infrastructure provides these companies with a competitive advantage in systematically defining test plans and then quickly achieving automation and generating large amounts of intelligent product critical data.

Automatic Testing Equipment (ATE) industry has pushed to develop a framework which would support the sharing of test information, data and results across various enterprise platforms. Usually the test engineer develops a test plan comprising of design of the testbed, equipment, test specification and other testing requirements. Based on the test plan, the test equipment is assembled and testing team orchestrates the automation requirements and further collects, analyzes and reports the data upon test completion. Such a process of developing tool sets that automate the test activity is known as business process automation.

The test process for any given company can encompass test plan development, equipment selection, automation software development, data collection and storage, data analysis, test report/data sheet assembly and publication, supply chain test monitoring (contract manufacturing), test station utilization, test station reservation and scheduling, test asset calibration and tracking, and manufacturing execution system (MES).

Technologically, the testing system and their framework can be classified into three main groups of systems. The first one represents the multiple standalone station which do not share any data, computing resources (such as server, data storage among others), test & data formats. These systems are highly fragmented and have a significantly different test data and process format from one test station to another. This configuration represents fragmentation to the extreme end where the test data format may vary from one test-station to another test-station within the same group resulting in an extremely inefficient system.

The second group of testing systems and framework include a system with its own dedicated file server where the test data and the test plans are centrally deposited and stored within an organization or a group. This obviously provides a more centralized approach to the standalone system as described above. In such configuration test plans typically begin with engineers developing text to spreadsheet plans with various individual formats and storage locations. These then translate into individual automation plans and automation solutions with minimal amounts of reusability. In both above cases, once automation is developed and in place, the production, storage, analysis and publications of results ranges from local text files to haphazardly organized file shares.

The third approach is a client-server based system for configuring and managing the test station and test data and process. This involves a structured and organized approach to managing the data and its format for providing higher degrees of interoperability to users within the same group or organization. The structured approach gains efficiencies in structuring data however creates a very proprietary and investment intensive system. The system in such scenario may not be interoperable within geographically dispersed group/organization and will definitely not be interoperable across various organizations.

Each of these approaches introduces several challenges and therefore inefficiencies within the organization. Each of these traditional methods means internal investment of proprietary systems which, one at a time, provide business process automation to the phases above. Companies have previously followed an evolutionary path to address this process. Such unstructured management of test plans and handling of test data and results leads to productivity losses due to issues related to data portability, data organization and absence of a common platform for sharing the data within organizations and among other organizations. This creates confusion in organization of results as well as communication and publication challenges. Format of result publications and analysis reports vary from one organization to another and in many cases from one group within an organization to another group within the same organization. The absence of a unified standards and process for such test data sharing and management leads to a challenge in data management.

The inefficiencies and absence of a unified process have led to a need for an automated enterprise test system framework which allows various organizations to share data across multiple test platforms. To further leverage this unified environment a configurable test-case library can be developed and shared across several platform's based on test equipment specifications and Design Under Test (DUT) requirements. Users may then use existing test-cases and avoid developing the specific test-cases for their design thereby, adding efficiency to this overall process. Automatic Test Markup Language (ATML) has been recognized as a standard which provides XML based test information exchange among various ATEs making them interoperable.

SUMMARY

This invention allows a more open and interoperable enterprise solution. In this case a test case library can be developed and shared across several platforms based on the test equipment specifications and the Design Under Test (DUT) requirements. Users can then use these existing test cases and avoid developing the specific test cases for their design thereby, adding efficiency to this overall process. Further the invention provides a framework where the testing results can be shared and deciphered across multiple platforms and users. In order to ensure functionality such as interoperability of test data across multiple systems/platforms, a standard such as but not limited to ATML is followed for the overall system design.

The test station client side of the overall system is referred as the Agent which is executing on a Local Test Station connected to the Device Under Test. The agent maintains a constant communication with the backend system and overall application. The agent is responsible for data collection, data assembly and transporting it to the backend server system comprising of database servers, application servers, configuration and user management system server and reporting system server among other hardware components.

The backend server system stores the data from all the connected test stations. The data organization is dependent upon a specific test plan. This data is then reorganized for efficient data analysis and report generation. Test equipment and availability can be tracked and linked to the test plan in support of project scheduling and management. This capability supports a single-site or world-wide capability. Assets can be tracked and the database capability of this product enables calibration and maintenance information to be monitored.

The system user is able to mine the data in order to perform engineering analysis and overall report generation. Engineering analysis workflow allows a user to select a part of the whole data, assign mathematical analysis functions for issues such as performance judgment, reliability analysis, characterization and manufacturing test among others. As the product development lifecycle moves into the manufacturing and commercialization phase, such automated tests will continue to be run on each product as it moves through the manufacturing workflow. Such analysis is the key component of business intelligence analysis phase for a product development and manufacturing organizations.

The test plan development component provides a standardized method of developing the test plan. This component supports plan development across multiple users and locations. The test development component would further allow sharing the test plan and obtaining its approval from other stakeholders. The test plans can be linked to equipment availability and test software, and may be used as the basis for the actual test flow execution. The Test Software Library management component is interfaced with test plan development component. This automation system component maintains one or more reusable software libraries. Any user connected with the overall system can access any part of the library or add other test routines to the existing library.

The system further provides users the ability to create and manage the reports of test data in a consistent and simplified manner. Customizable reports developed using the tools within this system, can be published, stored, and distributed from within the system. Reports can also be reusable to allow similar information to be reported over time or location using new data. This capability not only allows a user to monitor in-house processes, it also allows the user to monitor contract manufacturing or distant sites. These reports can further be published with various levels of access control with other users within a group, entity or outside of entity.

DETAILED DESCRIPTION OF THE INVENTION

Figure 1:
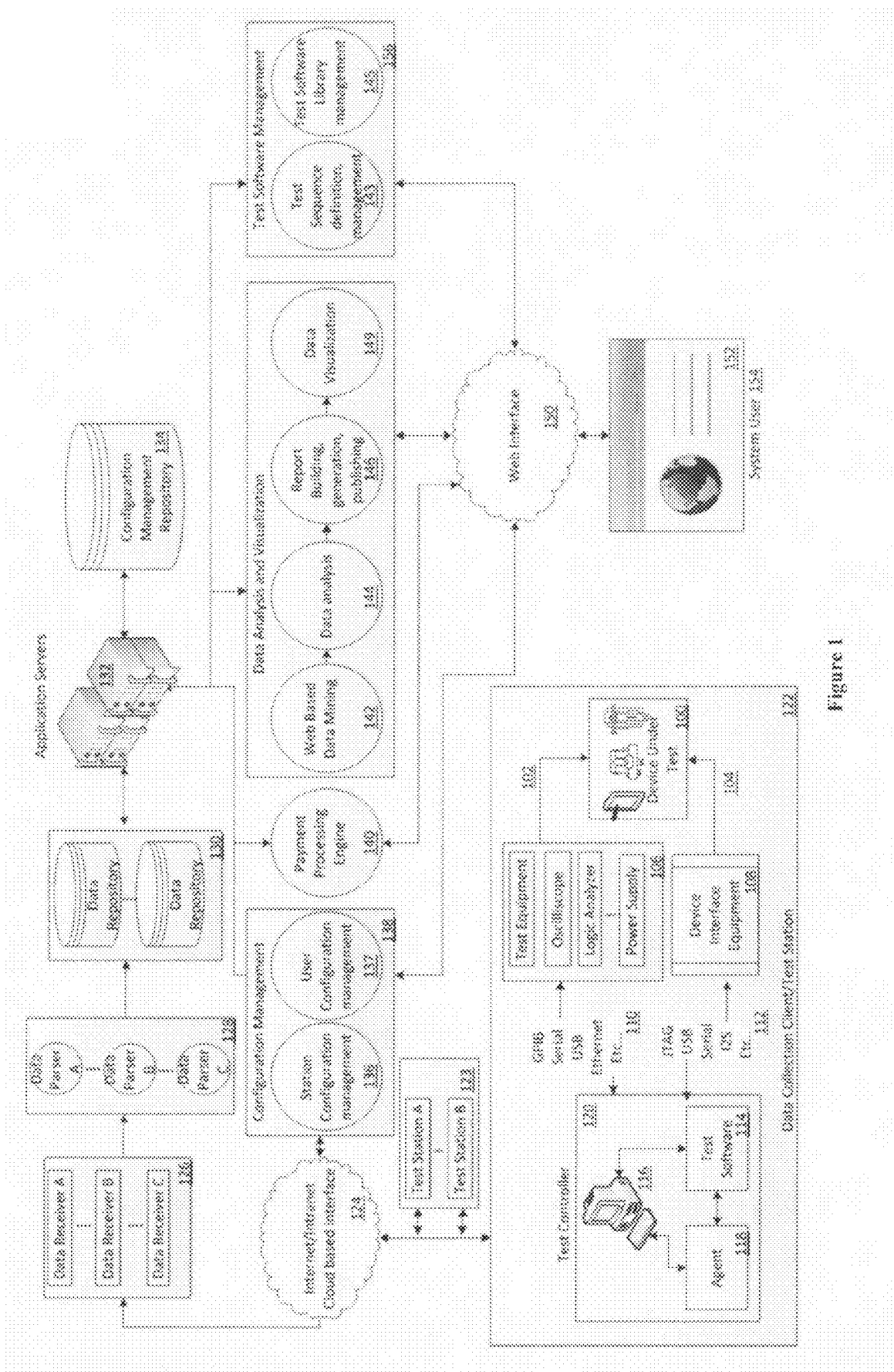
FIG. 1 shows the Entire System Diagram

FIG. 1 represents an embodiment of the overall system, i.e. an enterprise tool for planning, executing, managing, collecting, storing, analyzing and reporting data related to automated testing. The various users of the system may be test operators, test engineers, design engineers, managers, quality assurance staff, customers and vendors.

The Device Under Test (DUT) is referenced as 100. 100 may be either a physical device or a software component where test observations and measurements may be conducted. Examples of devices include, but are not limited to electronics components and systems like semiconductor chips, processors, circuit board assemblies and components. Physical devices may also extend to mechanical items and mechanical products such as metal fasteners, pressure tanks and engine components. A device may also be further extended to support measurement of physiological organisms in the bioscience domain. Data collection is not exclusively associated with physical objects. Software modules may also be tested and characteristics of the software could be measured and analyzed and may therefore also be considered as a unit under test. Data collected and managed by the system originates from observations and measurements of 100. Such measurements may be, but are not limited to, sensor measurements, analog and digital voltages, characteristic observations, performance criteria, and collection of software statistics. Specific part states or environmental stimuli like voltage, temperature, and device mode can be generated and used to stimulate 100. These measurements and stimuli are generated and imparted to the Device via interfaces 102 and 104. 102 are the interfacing signals connecting one or more test equipments 106 with device 100. The interfacing signal may connect through wired or wireless logical media. Test equipment 106 is used to generate stimuli and conduct measurements and observations on 100. 106 may consist of, but is not limited to oscilloscopes, power supplies, logic analyzers, protocol analyzers, or dynamometers. These may generally be but are not limited to off the shelf equipment, which interface with device 100 via interface item 102 and with the test controller via 110. 110 is the physical and logical protocol layer which is used to connect 106 with test controller 120. 120 comprises of a physical processing device such as a PC 116, in combination with an Agent 118 and Test Software 114. Layer 110 enables, commands and controls communication from test controller 120 to test equipment 106. These control interfaces may be but are not limited to GPIB (General Purpose Interface Bus), serial, USB, wired and wireless Ethernet. On the test equipment measurement side, 106 may record measurements or may only be a data collection method from which data is passed back to test controller 120. In the latter case, 114 would processes the data and create a resultant measurement and judgment.

Test controller 120 commands and communicates with 100 via 112, 108, and 104 to control states, program modes, load executable programs, read back information, and other tasks.

104 is the physical interface to access device connections on 100. Such interfaces are the logical and physical communications and access points required to connect the Device Interface Equipment 108 to the device under test 100. Communication channels include but are not limited to SPI, I2S and other industry standard or proprietary standards.

The Device Interface Equipment is referenced by 108. This is generally but not limited to customer interface circuit, software test harnesses, or physical fixture required for 100 to have test and or command and control points made available for 120. Interface 108 may contain items such as relays, customer circuitry, special mechanical adapters, or anything else required to control and communicate with 100.

Physical and logical interfacing protocols such as JTAG, USB Serial and I2S and other industry standard or proprietary protocols is referenced by 112 and is employed for connecting test controller 120 with Device Interface Equipment 108. This interface is used to pass bi-directional information between the test controller 120 and the device interface equipment 108.

Test Software 114 comprises test routines and test sequencers. Test routines are algorithms and software implementations executing on the hardware/PC 116 that are responsible for implementing test and measurement procedures. Procedures are implemented using combination of instrument control, device control, device stimuli, protocols, sensor observations and processing routines to calculate measurements and observations. Test sequencers provide the test routine execution order, control and results partitioning and organization.

Figure 2:
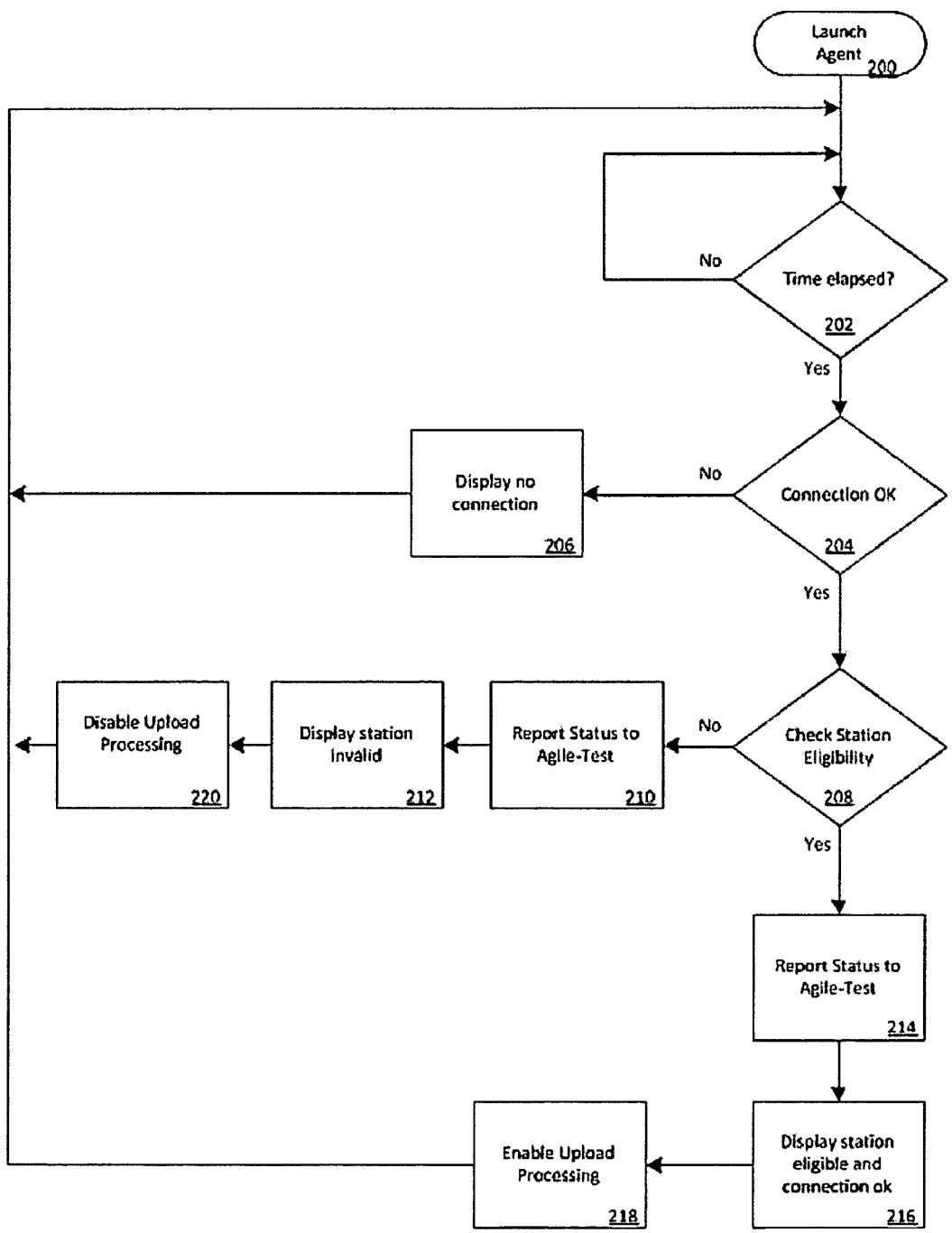
FIG. 2 shows the Status of the Agent
Figure 3:
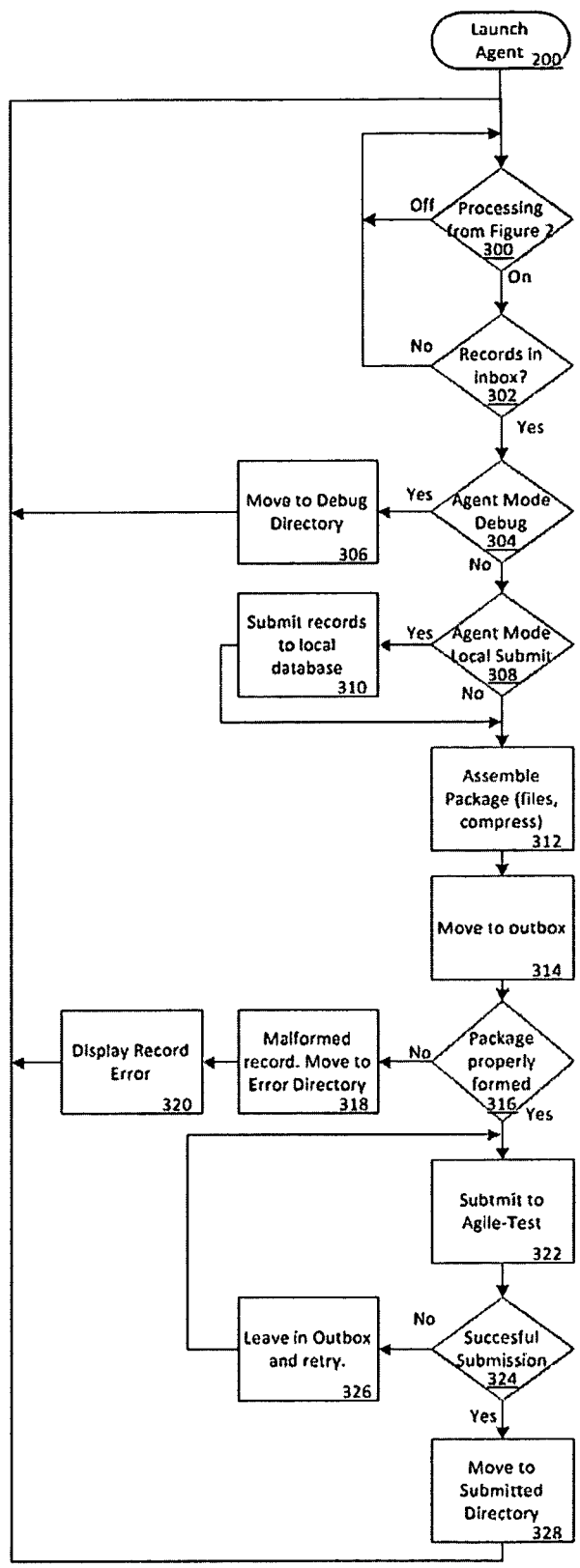
FIG. 3 shows the Process for Upload of Test Data

Agent 118 is responsible for detecting/receiving notification of results from the test software 114 then encrypting, compressing, and submitting packaged resultant data to data receiver module 126 via an internet interface 124. Agent 118 also maintains periodic communication with the configuration management subsystem 138 via internet interface 124 to verify eligibility and connectivity for data upload. FIGS. 2 and 3 further illustrate the agent status process and data upload process. An agent must be operating on each test controller participating in the system.

Hardware/PC 116 is any type of computer and operating system, either industry standard or proprietary, which can execute Test Software 114 including test routines and analysis. It provides the logical and physical interfaces to connect with 110, 112, and 124; and human interfaces to connect and interact with 122 via 116.

122 represents an entire Test-Station as a sub-system/module, comprised of components labeled 100 to 120. 122 is the physical and logical association of all the devices, equipment, algorithms and interfaces for the conducting of tests. Test-Station 122 is managed by the overall system disclosed as part of this invention. 122 may vary from the sub-system configuration described above to another sub-system configuring comprising of different components or its variants. Further, 122 may be placed in a single deployment or as a part of larger system including numerous test stations in close proximity or in geographically distributed locations. 123 indicates that there may be any number of instances of the test station. The test stations may or may not be the same and they may or may not be in the same geographical location.

124 represents the web-services connections between Test-Station Subsystem 122 and data collection and configuration management subsystems, which provide a communication and data transportation function between the test station and the rest of the system. This interface is used by multiple participants in the system and is a broker between the data receiver(s) 126, agent(s) 118 and configuration management module 138.

126 will receive encrypted and/or compressed data packets from the 124. Data receiver 126 accepts the data packets, decrypts and decompresses them, and checks the integrity of the data packets. There could be multiple instances of Data receiver 126 configured and executing simultaneously on one or more servers or configurations. Further 126 may be geographically dispersed based on the system configuration requirements.

Recovered data packets from 126 are transmitted to Data Parser 128. There may be multiple Data Parser instances of 128 executing on various data formats. 128 stores the parsed datasets into an appropriate backend data repository 130. 130 can be but is not limited to databases and file storage. Instances of 126, 128 and 130 may be geographically collocated or distributed.

The data repository 130 stores decrypted, decompressed, parsed, validated data. There may be one or more instances of data repositories on any given site as well as geographically distant deployments. Furthermore, 130 provides data organization and logical and efficient access (retrieval) to other components of the overall system. Data in 130 may be later annotated and commented on by other system participants.

Data from data repository 130 is accessed by physical application servers 132, containing the logical and physical items 124-150. These are servers with processors, memory, writable media, power supplies and located in temperature controlled facilities such as a data center.

134 is the configuration management repository. This houses meta-data associated with the system configuration information. The configuration management subsystem can be implemented as, but is not limited to, a database. It can be but is not limited to storage of usernames, passwords, payment information, station information and workspace saving and other information associated with the configuration management module 138.

The configuration management module 138 comprises Station Configuration and Management Module 136 and User Configuration and Management Module 137. 136 contains account configuration related information such as the entity owning the stations, the station types, the users assigned for managing a station, equipment associated with a station, among other station attributes. When a user initially attaches a Test Station 122 to the system, 136 is invoked and deploys the agent 118 to the test station 122. Together, 136 and 118 record all the information associated with the actual deployed station and owner. Additionally, 136 is responsible for deploying updates to the agent as updates become available. 136 can also identify and track test equipment 106 and test software 114 in the test station 122 to support station hardware and software maintenance. 136 also tracks the number of station licenses that have been activated. The details of process flow of module 136 will be further explained in FIG. 6.

Figure 5:
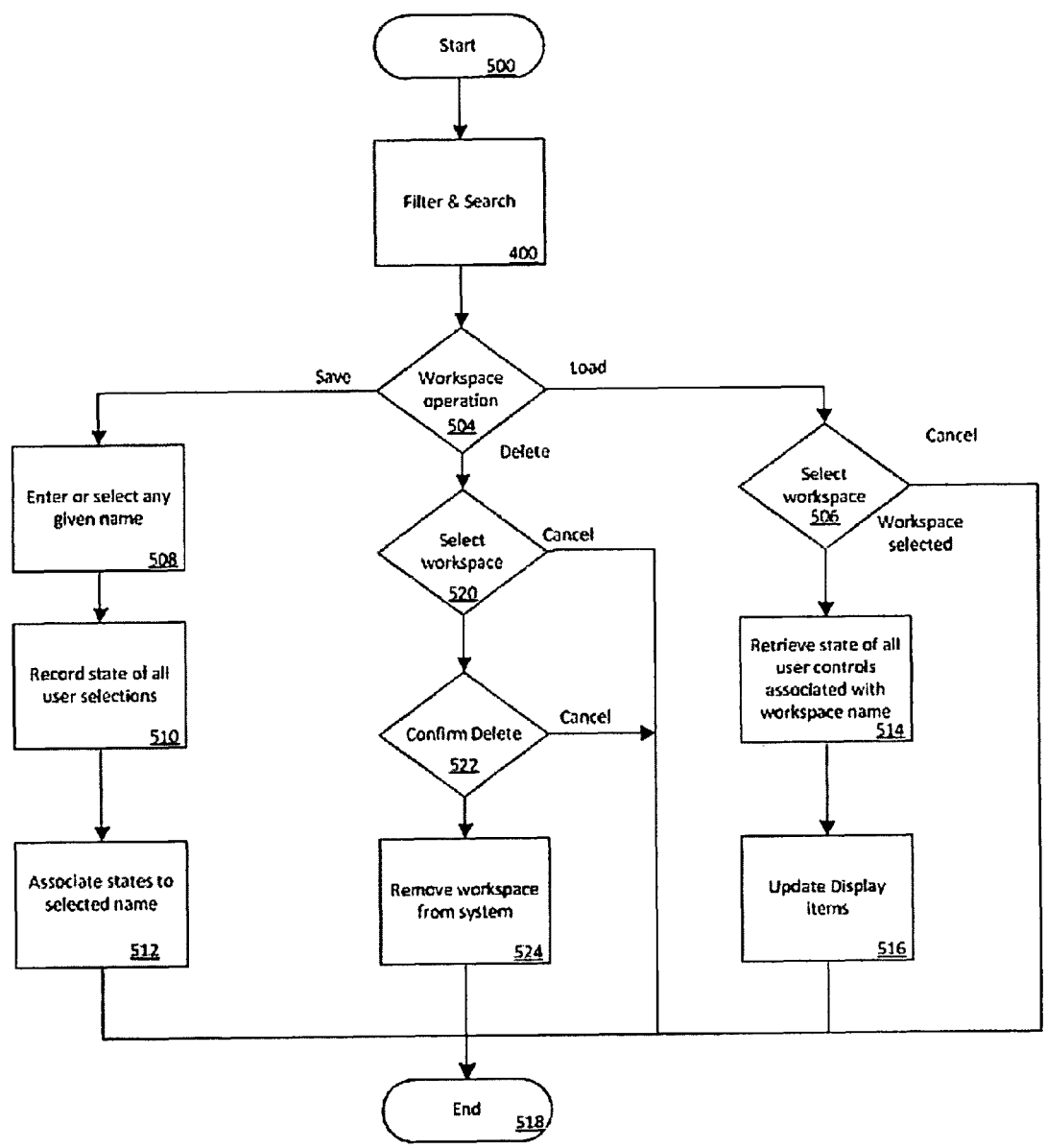
FIG. 5 shows the Saving of User Configurations

137 is the user configuration and management module. This module is responsible for creating users and managing their permissions and preferences within configuration management system 138. Every registered user within the system is associated with one or more entity. 138 plays a vital role in selecting and saving the customized workspace preferences for all users. This module provides them with several advanced system configuration options, such as user workspace, filter and select criteria for data, and organization of results returned from the mined data. FIG. 5, User configurations discusses further details about the user configuration flow.

The payment processing engine 140 is responsible for accepting and processing payments, managing policies for various payment options, and managing and displaying payment history. 140 keeps track of the amount of data purchased, the number of user and station licenses purchased and activated among other payment parameters.

The Data Analysis and Visualization Module 149 comprises the Data Mining Module 142, the Data Analysis Module 144, the Report Building, Generation, and Publishing Module 146 and the Data Visualization Module 148. The data mining interface 142 allows system users to interact with data stored in the data repository 130 by providing capabilities such as browsing, search, filtering and commenting on selected data. The user preference module provides the user-level customized user-interface for interaction with the stored data in 130. FIG. 9 provides an example illustrating the real user interaction with 149 for accessing the stored data in data repository 130. The Data Mining Module 142 allows the user to proceed to the Analysis module or to jump directly to the QuickVIEW module. The QuickVIEW flow and process is described in further detail in FIG. 4.

Figure 4:
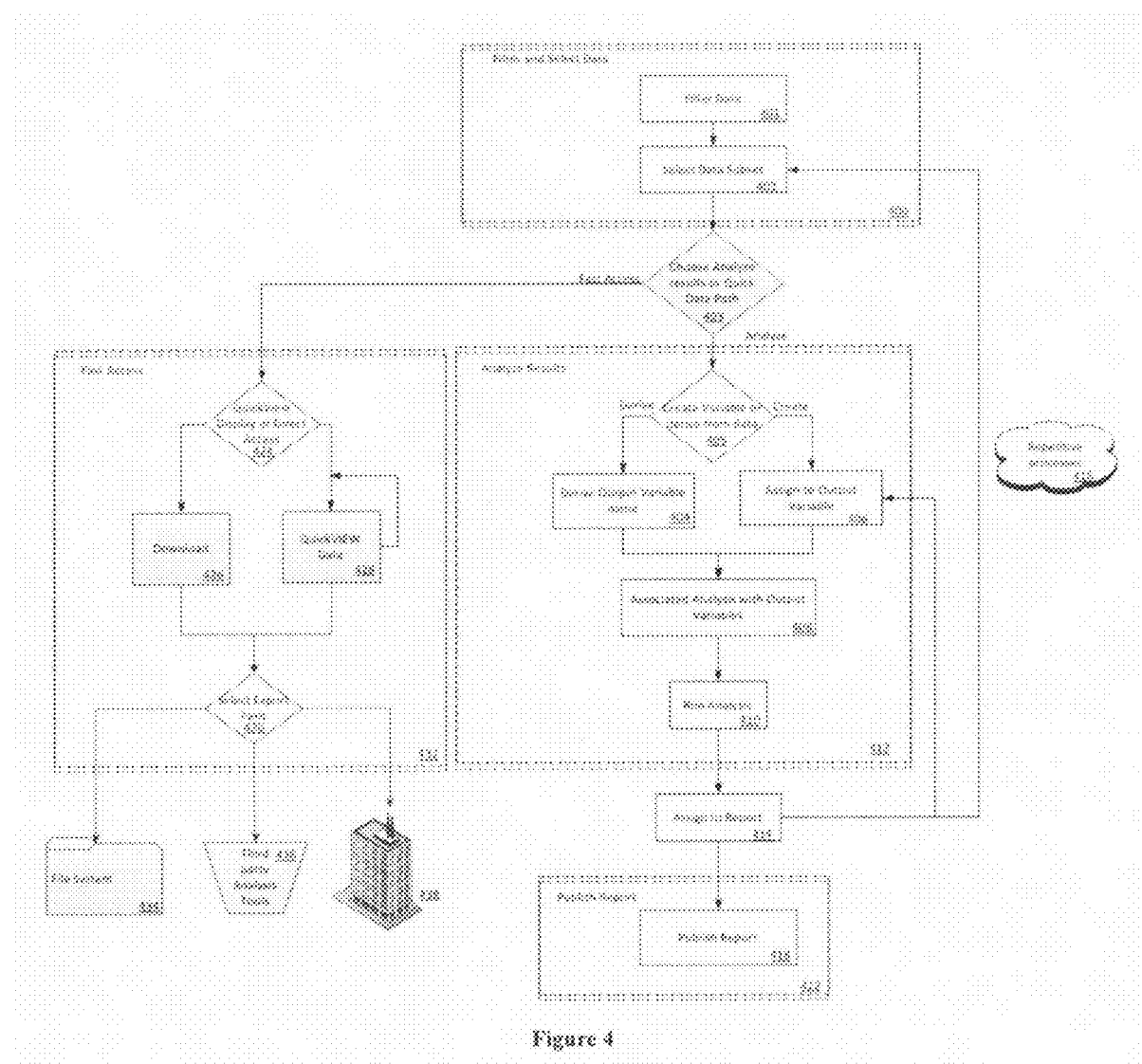
FIG. 4 shows the Entire Data Processing Flow

The Data Analysis Module 144 allows the user to apply standard analytical functions and calculations such as standard deviation, process stability, and others data selected from data repository 130. It also supports sending data to and receiving results from external analytic software such as Matlab in order to provide extremely advanced analysis capability. The module allows the user to associate data with user-defined object(s) referred to as (an) output variable(s). The user can further use the output variable as a system object and perform operations and analysis. FIG. 4 illustrates the detailed data analysis flow.

The Report Building, Generation, and Publishing Module 146 allows users to define or reuse their customized reports using data analysis of Data Analysis Module 144. Data analysis reports for a selected output variable or group of output variables from 144 are then assigned to 146 for publication and sharing with other system users based on user defined permissions. Processed reports and report templates are stored in a configuration management repository 134. 148 is the Data Visualization Module which provides users the capability to interact with the mined and analyzed data against each output variable.

The Test Software Management Module 156 comprises the Test Sequence definition and management module 143 and Test Software Library management module 145. 143 provides the capability to develop sequential test flows (test sequences) via the web interface 150 which can then be downloaded to the test station(s) 122 and 123. The Test Sequence development block 143 is accessed via the web interface 150. From this tool, the user defines a sequential test flow which is subsequently stored in the configuration management repository 134. The user may then download this test sequence, via the station configuration and management tool 136, to the test station 122. The test software 114 within the test station accepts the sequence and is able to interpret and run the sequence. 145 allows users to add test software to the configuration management repository 134 from the web interface 150. Software that is added may be flagged as private, in which case only the user or users group make access and use this software. The software may also be flagged as public, which makes the software available to all systems users. The software may be selected from the web interface 150 and downloaded to the test station 122 via the station configuration and management tool 136. Once the software is downloaded to the test station, the user of the test station may incorporate it into the test program.

Users can interact with the overall system for data visualization and analysis through the user interface 150 which could be a web-based program executing on any web-browser (on a physical computer or a mobile device such as a tablet) or a client based interface. 150 serves as a communication layer between web-browser-based front-end 152 and the backend system. 152 provides user with capability for interaction with backend system for all functions related to 138, 140 and 149 as discussed above. The system user 154 interacts with the overall system for various tasks as discussed above.

FIG. 2 shows the process of agent executing on the test controller as described in FIG. 1. As part of the client side of the overall system implementation the process continuously monitors the agent connection status with the backend system. The initial state 200 of the process is to launch the agent, which may be manually or automatically upon the system start-up. Decision 204 controls the process flow after the connect attempt 202. The subsequent actions of the agent process depend if the connection was or was not successful. 206 is the process that the agent follows if decision 204 was negative. At this point, the agent notifies the user, via an icon in the test controller menu bar that the agent was not able to connect to the station configuration and management function 136. The agent will iteratively return to 202 and restart the polling process. 208 is the process flow the agent follows if decision 204 was positive. At this point, the agent communicates with the station configuration and management function 136 and sends 136 the specifics of the test station that the agent is running on. 208 then receives confirmation that the agent is either running on a valid test station or that it is not running on a valid test station. 212 occurs when the agent receives notification from the station configuration and management function 136 that the agent is not operating on a valid test station. When this happens the agent will notify the user, via the icon in the test controller menu bar, that the station is not a valid test station. In addition the agent will set the "Processing" flag to off in 220. This flag is used by the data monitoring functionality of the agent, described in FIG. 3, to enable or disable data upload capability. The agent process will then restart the polling process by returning to 202. 214 is the step in the process that occurs after the agent receives notification from the station configuration and management function 136 that the agent is running on a valid test station. The agent will then upload additional information about the test station to the station configuration and management function 136. 216 and 218 are the final steps in a successful connection to 136. In 216, the agent will notify the user, via the icon in the test controller menu bar, that the test station is connected to the Agile-Test system. In 218, the agent will set the "Processing" flag to on which will which will enable the data processing as described in FIG. 3. Finally, the agent will restart the polling process by returning to 202.

FIG. 3 depicts data-file movement and processing within the agent and transport processes. It shows various possible states a data-file may enter before and during communication with the backend server system. Once the agent is launched in 200, it waits for the "Processing" flag, as described in FIG. 2, to be set to on. 300 is the decision step for evaluating the processing flag. If the flag is set to off, the upload process is denied and the agent continues to monitor the status of the flag. If the flag is set to on, the upload process is allowed to proceed. After validating its connection integrity and station eligibility, the agent initiates the process of data transfer and data parsing through 126, 128 and 130 (discussed in FIG. 1) then storing the data in 130 (FIG. 1). In order to move this data file, the agent process module checks the data present in system inbox for being transmitted to the backend system 302. The Agent module further could be in a debug state mode or submit state mode. In debug mode 306, the system allows the agent to operate normally without submitting files to the backend system servers while in the Agent Mode of Local Submit, the system allows a user to submit the data file to the local database 310. This mode may be enabled by the user to allow the agent to submit files to a local database, specified in the agent control panel, in addition to submitting the files to the cloud database(s) 124-130 in FIG. 1. If the system is not in any of the three above discussed modes, then the system is in transmission mode where the files are submitted to the backend data store. In order to achieve this, the data files are assembled and compressed using the native or a third party compression algorithm 312, and then the files are moved to the outbox 314 to be transmitted. The system at this point checks the assembly of file 316, if the file is not assembled properly then the file is moved to the error directory 318 and the system displays the corresponding error in record uploading status 320. 318 occurs when 316 determines that an error is present in the data package. At this point the data package is moved from outbox to the 'error' directory. After an error has been identified, and the package moved to the error directory, the agent displays an error message via the agent icon in the test controller menu bar. At this point, the agent will resume polling the inbox by returning to 302. However if the file was assembled properly, the system continues submitting the file until it gets a proper connection from the backend and the file is submitted. The system communicates with the data receivers 126 (part of FIG. 1) to determine if the packaged data was successfully received. Once the file is successfully submitted the system also places the copy of the file to the submitted directory 328 along with other attributes such as time, stationID, and the user who submitted the file. At this point, the agent will resume polling the inbox, returning to point 302.

FIG. 4 depicts the user integration for data visualization with the overall system. This illustrates the iterative process of searching, selecting and analyzing data as well as how the data gets reported. The first step in the data processing flow consists of selecting the desired data set from a large data set by limiting the conditional scope of the data 400. Such selection of the data set in 401 is accomplished by selecting and deselecting condition parameters associated with the overall data population. These conditional parameters include the start time of test, unit serial number, test name, test limits, test outcomes, environmental conditions, test station, test operator among others. Output of this stage is fed to Select Data Subset 402. This represents an iterative process of performing multiple analyses on multiple data variables. From the reduced data set of 402, the user selects 1 or more similar data subsets to be further analyzed or having the underlying data assessed quickly 403. This flexibility allows a user to carry out either detailed analysis on similar types of data over different statistical populations, or quickly visualize the selected data and export and/or download it.

Analyzing results 412 consists of steps, drive output variable name 404, assign to output variable 406, associate analysis with output variable 408 and run analysis 410. Analysis of results 412 could be carried out two possible operations after the data subset(s) are selected in step 402: (1) by driving an output variable name 404, (2) by assigning to the output variable name 406. This allows a user to use the data subset(s) 'names' that exist in the database as "output variables". This (default) case allows the user to keep the data subset(s) name and carry it forward to step 408 and for inclusion in the final report 414. Analysis is performed on "output variables", so the data subset name(s) in this case are assigned to output variable(s). 406 allows a user to associate a name different than the data subset(s) name as in case of 404 with an output variable. Such flexibility allows a user to rename data subset names for the final report 414 and make it more customizable as per their requirements and needs. 408 associates any possible analysis types such as mean, standard deviation and maximum among others with any selected output variables from either 404 or 406. Any combination of analysis types may be associated with any combination of output variables. This feeds to the next step of actual analysis 410. In addition to built-in analysis types, 408 and 410 may also be configured to send data to third-party or proprietary analysis software to enhance the analysis capability of the system. During these steps of 400, 402, 404 and 406 all the selections are stored in the local memory of the system and when the user can save filter and selection options at the backend to save the workspace discussed in detail in FIG. 5. Up to this point, only data pointers have been used to filter and select data subsets. However the actual data has not been processed. During analysis 410, the backend servers will execute the assigned analysis types of output variables 408 on the selected output variables of steps 404 and/or 406. Process 414 is the assigning of analysis results obtained in 410 for a report. The user will keep assigning results to a report using the iterative process until completing assigning all the variables to the report as per their requirements. This iterative mechanism, 416, of selecting various sets/subsets of data and assigning them to the output variable, executing analysis and assigning the analysis to a report could be executed multiple times until all the requirements for preparing a report is accomplished.

The final step in the data selection and reporting process is publishing the report 418. Publishing means the report is formatted into a downloadable human readable format and made visible to a predefined audience. This allows the user to select the group of people who can view a report as well as access permissions associated with the report such as read, write and modify.

The user can also select the option of Fast Access of data 432 from 403. Step 432 allows the user to quickly view the data and apply some simple data manipulation and visualization techniques 424. This processed data can further be either downloaded to the local machine or onto a remote connected memory drive 434, applied to a third-party tool/environment such as a matlab, spotfire, Simulink among others 436 or exported to a third party interface either connected through a web-based environment, application programming interface or a client server application running on host machine 438. The QuickVIEW data process allows a fast path from data filter and select to visualization and export.

FIG. 5 demonstrates the process of User Workspace Configurations. A user can select the Data Visualization module 500 (shown in FIG. 1 as module 148). The user can select one of three options of Workspace Operations Management Module 504, Save, Load or Delete. Users interact with large numbers of datasets. During this process, the user may create and manage different perspectives to mine and manage data. These perspectives are referred to as workspace in this invention. The user often may interact with the data in a specific methodological manner or style. It would be more effective and efficient if a user is allowed to save their workspace to later apply these workspace templates to analysis of different sets of data. The user workspace configuration allows such functionality. The user saves a workspace to backend configuration management system 138 (in FIG. 1). 138 then records the state of all user selections 510. At this time the entire state of the workspace is collected and represented in the backend system configuration management repository. The user can further associate these states with the selected names 512. At this time all the metadata gets associated with the user workspace. The user can load existing workspaces from a backend system configuration management repository 506. This would allow users to retrieve the entire state of all user controls, selections and configurations from repository 130 (FIG. 1) associated with selected workspace 514 and update the user display with the new workspace 516. A user can also request for removing existing workspaces from the backend system configuration management repository. The system prompts the user to confirm removal of workspace 522 before permanently removing it from the backend system configuration management repository. Upon the user's confirmation, the workspace is removed from the list of saved workspaces in the backend system configuration management repository 514.

Figure 6:
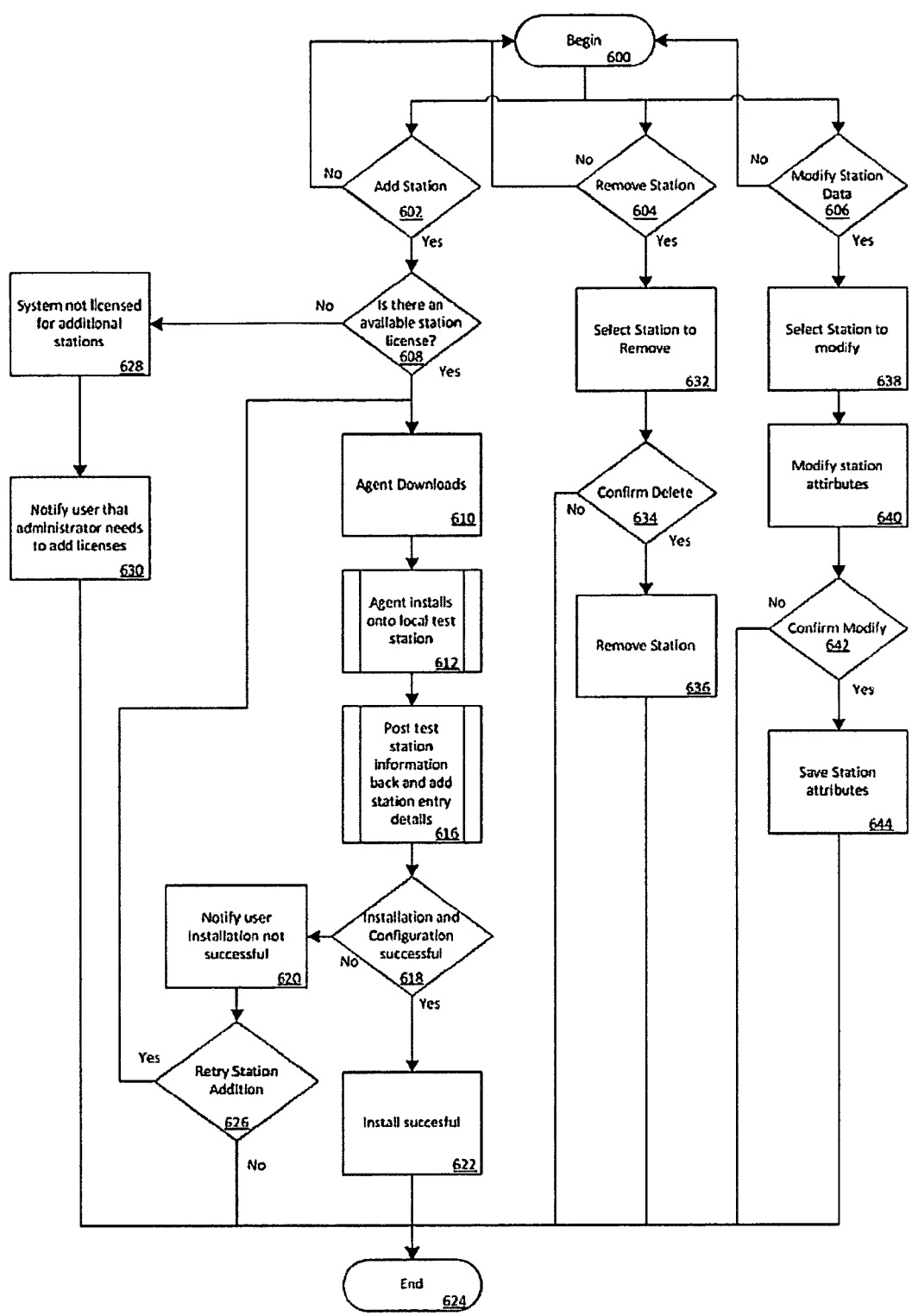
FIG. 6 shows the Station Management

FIG. 6 shows the process of station management. Station management configurations are stored in configuration management module 138 (shown in FIG. 1) via web-interface 150 (shown in FIG. 1). The user has the ability to add one or more station 602, remove one or more station 604, and modify station data 606 from the high level station management configuration module 138 via web services.

Upon selecting 602, the system checks for the availability of a new license 608. If the entity has no more system licenses 628, the system requests the user to add new licenses for the entity via their system administration 630. However, if the entity has a new license, the system allows the user to download the Agent 610. At that time the agent launches and extracts information regarding that particular station and gets installed on the test station 612. The agent, the test station and other system information, such as, but not limited to machine name, OS version, system owner, and hardware, is sent back to the backend system and stored in the station management configuration module. The information collected in 614 is posted back to the system. This becomes part of the permanent station record. The invention tracks the version of agent that is deployed to the test station 616. Once the information is received, the backend system checks for the correct installation of the agent 618, in case of a successful installation 622, the process terminates, otherwise the user is provided with an option to download the agent and install it again on the test station 626.

Similarly to adding a station, the user can select to remove one or more station 604. The user is then requested to select a station or a group of stations to be removed from the entity station configuration 632. Upon confirmation of deleting the station 634, the station(s) are removed from the system level station management configuration.

The station user can further modify the default or previously set station attributes such as station name, user name, or any other station attributes in 606. In such a scenario the user is prompted to select the station to modify 638, and select attributes to modify 640. On providing new attributes, the user can confirm the modification 642, to save those attributes in the station management and configuration system at the backend.

I claim:

1. An electronic system for automated testing of a device with an output of measurable physical characteristics, comprising:
   test equipment to continuously control, physically stimulate, request and receive the measurable physical characteristics output from the device and relay the measurable physical characteristics by electronic signals data transmission;
   a test controller module comprising:
   a test software providing continuous instructions to run a testing process by executing test routines and test sequencers and communicating with test equipment to instruct it to control and stimulate the device, then request and receive the measurable physical characteristics by electronic signals data transmission, then save the electronic signals data in various machine readable formats for submission to the electronic system;
   a test agent process which continuously monitors and polls for notification that new electronic signals data is received from the test equipment by the test software for submission to the electronic system;
   a central processing unit on which the test software runs;
   memory and machine readable media coupled with the central processing unit, the test software residing within the memory and machine readable media;
   the test controller module coupled to the test equipment by a plurality of specific electronic connections from the central processing unit;
   a networked cloud-interface for storing the saved electronic signals data, wherein the test agent process verifies connectivity of the central processing unit and the test controller module to the networked cloud-interface;
   a data receiver module which receives the electronic signals data from the test agent process;
   a data storage unit which reads, parses and stores the saved electronic signals data onto permanent data storage;
   a rack of application servers permanently coupled to the data storage unit to access the saved electronic signals data;
   a data analysis module for applying transformational functions and plotting the electronic signals data according to mathematical and statistical formulae;
   a reporting module for recursively filtering and expressing the electronic signals data into a specific human readable formatted results desired by an end-user;
   a publication module allowing the end-user to create final documents based on the electronic signals data;
   a visualization module allowing the end-user to view the electronic signals data in a graphical form;
   a web-based interface linked to the rack of application servers through the data analysis, visualization, reporting and publication modules to request the specific human readable formatted results desired by the end-user through specific parameters defined by the electronic system for automated testing;
   the web-based interface also providing the end-user free-form access to the electronic signals data, allowing direct browsing, search, filter and commenting functionalities.

2. The electronic system of claim 1, further comprising:
   a user-security module for verifying a user of the electronic system for automated testing and which tracks user access level for reports generated by the reporting module;
   a user-configuration module for saving the specific human readable format and a display configuration which the user can use to display the electronic signals data for reports the user requires from the reporting module; and
   a controller-configuration module which saves the machine readable formats in which the test agent process places the electronic signals data output from the device being tested, and the specific electronic connections which couple the test controller module and the test equipment through the central processing unit; and
   wherein the test agent process communicates with the user-security module, the user-configuration module and the controller-configuration module in verifying the user station and the electronic signals data.

3. The electronic system of claim 1, wherein the device is selected from a list comprising semiconductor chips, processors, circuit board assemblies and circuit board components.

4. The electronic system of claim 1, wherein the device is a mechanical item or a mechanical product such as a metal fastener, a pressure tank, or an engine component requiring stress testing and physical metrics.

5. The electronic system of claim 1, wherein the device supports measurement of parameters of biological or physiological organisms occurring in nature or in a bioscience laboratory.

6. The electronic system of claim 1, wherein the specific electronic connections coupling the test controller module to the test equipment from the central processing unit are selected from a group comprising general purpose interface bus, serial and parallel connectors, universal serial bus, wired or wireless Ethernet, or any other wired, wireless, acoustic communication channel.

7. The electronic system of claim 1, wherein the measurable physical characteristics are selected from the group comprising sensor measurements, analog and digital voltages, characteristic observations and performance criteria, and the test equipment is selected from a group comprising oscilloscopes, powers supplies, logic analyzers, protocol analyzers, dynamometers, and other measurement equipment.

8. The electronic system of claim 1, further comprising a user-augmented test software library which the end-user can augment utilize and re-use and which contains test software for the end-user to download.

9. The electronic system of claim 1, further comprising an ability to create and download test sequencers from the web-based interface.

10. The electronic system of claim 1, wherein the reporting module has a unique recursive filter which allows the end-user to continuous drill down into the electronic signals data from any direction.

11. A method for automated testing of a device with an output of measurable physical characteristics by an electronic system, the method comprising the steps of:
continuously controlling, physically stimulating, requesting and receiving the measurable physical characteristics output from the device by a test equipment;
relaying the measurable physical characteristics from the test equipment by electronic signals data transmission;
continuously receiving the electronic signals data output from the device being tested by a test controller module;
linking the test controller module and the test equipment and the device by a plurality of specific electronic connections;
relaying the electronic signals data to the test controller module through the specific electronic connections;
controlling test routines and test sequencers to run a testing process by a test software within the test controller module;
hosting and executing the test software on a central processing unit within the test controller module, coupled with memory and machine readable media, the test software residing within the memory and the machine readable media;
continuously saving the electronic signals data locally after placing them in various machine-readable formats by a test agent process within the test controller module;
saving the various machine-readable formatted electronic signals data to the memory and the machine readable media connected to the central processing unit;
continuously polling or awaiting event notification for the electronic signals data in an endless loop by a test agent process within the test controller module;
continuously uploading and storing the saved electronic signals as data to a networked cloud-interface by the test agent process within the controller module;
continuously receiving the electronic signals data to a data receiver module;
continuously reading and parsing the electronic signals data from the saved electronic signals data into a logical meaningful format;
storing the parsed electronic signals data from the saved electronic signals data in the logical meaningful format to a data storage unit;
accessing the parsed electronic signals data from the saved electronic signals data in the logical meaningful format from the data storage unit by a permanently linked rack of application servers;
recursively filtering and further expressing the electronic signals data from the saved electronic signals in the logical meaningful format into human-readable formatted results desired by an end-user by a reporting module;
grouping the human-readable formatted results into defined logical data objects and applying analysis functions on the defined logical data objects by a data analysis module;
annotating the human-readable formatted results with user-defined notes and associating the user-defined notes to the electronic signals data;
allowing the end-user to create final documents based on the electronic signals data by a publication module;
allowing the end-user to view the electronic signals data in a graphical form by a visualization module;
requesting the a specific human readable formatted results desired by the end-user by specific defined parameters to the method for automated testing of a device by a web-based interface linked to the rack of application servers through the data analysis, visualization, reporting and publication modules; and
allowing the end-user to randomly access the electronic signals data through the specific defined parameters defined by the end-user via the web-based interface.

12. The method of claim 11, further comprising the steps of:
verifying the end-user of the method for automated testing of the device by an user-security module;
tracking the end-user's access level for reports generated by the reporting module by the user-security module;
saving the specific user's human readable formatted and a display configuration by which the end-user can display their required electronic signals data in the form of reports from the reporting module by a user-configuration module; and
saving the machine-readable formats in which the test agent process places the electronic signals data output from the device being tested, as well as the specific electronic connections linking the controller module and the test equipment through the central processing unit by a controller-configuration module;
wherein the test agent process communicates with the user-security module, the user-configuration module and the controller-configuration module in the verifying step.

13. The method of claim 11, wherein the device is selected from a list comprising semiconductor chips, processors, circuit board assemblies and circuit board components.

14. The method of claim 11, wherein the device is a mechanical item or a mechanical product such as a metal fastener, a pressure tank, or an engine component requiring stress testing and physical metrics.

15. The method of claim 11, wherein the device supports measurement of parameters of biological or physiological organisms occurring in nature or in a bioscience laboratory.

16. The method of claim 11, wherein the specific electronic connections linking the test controller module to the test equipment from the central processing unit are selected from a group comprising general purpose interface bus, serial and parallel connectors, universal serial bus, wired or wireless Ethernet, or any other wired, wireless, acoustic communication channel.

17. The method of claim 11, wherein the measurable physical characteristics are selected from the group comprising sensor measurements, analog and digital voltages, characteristic observations and performance criteria and the test equipment is selected from the group comprising oscilloscopes, powers supplies, logic analyzers, protocol analyzers, dynamometers, and other measurement equipment.

18. The method of claim 11, further comprising the steps of:
   augmenting a test software library for re-use by the end-user,
   downloading the test software from a test software library, and
   utilizing the test software from the test software library.

19. The method of claim 11, further comprising an ability to create and download test sequencers from the web-based interface.

20. The method of claim 11, wherein the recursive filtering step of the reporting module uniquely allows the end-user to continuous drill down into the electronic signals data from any direction.

* * * * *